United States Patent
Wang

(10) Patent No.: US 9,595,539 B2
(45) Date of Patent: Mar. 14, 2017

(54) ARRAY SUBSTRATES AND THE MANUFACTURING METHOD THEREOF, AND DISPLAY PANELS OF ENHANCED SPEED OF FILM FORMATION

(71) Applicant: Shenzhen China Star Optoelectronics Technology Co., Ltd., Shenzhen, Guangdong (CN)

(72) Inventor: Zhiwu Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/765,833

(22) PCT Filed: Jul. 10, 2015

(86) PCT No.: PCT/CN2015/083745
§ 371 (c)(1),
(2) Date: Aug. 4, 2015

(87) PCT Pub. No.: WO2016/201752
PCT Pub. Date: Dec. 22, 2016

(65) Prior Publication Data
US 2016/0372494 A1  Dec. 22, 2016

(30) Foreign Application Priority Data
Jun. 19, 2015 (CN) .................. 2015 1 03469792

(51) Int. Cl.
*H01L 21/00* (2006.01)
*H01L 27/12* (2006.01)
(Continued)

(52) U.S. Cl.
CPC .... *H01L 27/1225* (2013.01); *H01L 21/02178* (2013.01); *H01L 21/02266* (2013.01);
(Continued)

(58) Field of Classification Search
CPC ...................... H01L 27/1225; H01L 21/02178
(Continued)

(56) References Cited

U.S. PATENT DOCUMENTS

| 8,890,145 B2 * | 11/2014 | Lin ................... H01L 29/78606 257/43 |
| 2010/0025675 A1 * | 2/2010 | Yamazaki ........... H01L 27/3241 257/43 |

(Continued)

*Primary Examiner* — Caleb Henry
(74) *Attorney, Agent, or Firm* — Andrew C. Cheng

(57) ABSTRACT

The present disclosure relates to an array substrate and the manufacturing method thereof, and a display panel. The array substrate includes a substrate and a plurality of thin film transistors (TFTs). The TFT includes a gate, a gate insulation layer, a trench layer, an etch stop layer (ESL), a source, and a drain. The gate insulation layer is arranged between the gate and the trench layer to insulate the gate from the trench layer, the source. The drain and the ESL are respectively arranged on the trench layer. The ESL is arranged between the source and the drain. The ESL is an aluminum nitride (AlN) film. In this way, the quality of the TFTs may be guaranteed, and the speed of the film formation of the ESL may be enhanced.

3 Claims, 1 Drawing Sheet

(51) Int. Cl.
*H01L 29/51* (2006.01)
*H01L 29/49* (2006.01)
*H01L 21/02* (2006.01)
*H01L 29/786* (2006.01)
*H01L 29/66* (2006.01)
*G02F 1/1335* (2006.01)
*G02F 1/1368* (2006.01)
*G02F 1/1362* (2006.01)

(52) U.S. Cl.
CPC ...... *H01L 27/1259* (2013.01); *H01L 29/4908* (2013.01); *H01L 29/517* (2013.01); *H01L 29/518* (2013.01); *H01L 29/66969* (2013.01); *H01L 29/7869* (2013.01); *G02F 1/1368* (2013.01); *G02F 1/133512* (2013.01); *G02F 1/133514* (2013.01); *G02F 1/136286* (2013.01); *G02F 2201/123* (2013.01)

(58) Field of Classification Search
USPC .......................................................... 257/43
See application file for complete search history.

(56) References Cited

U.S. PATENT DOCUMENTS

| | | | |
|---|---|---|---|
| 2015/0171227 A1* | 6/2015 | Ahmed | H01L 29/66969 257/43 |
| 2015/0179773 A1* | 6/2015 | Ahmed | H01L 29/66969 257/43 |
| 2015/0187956 A1* | 7/2015 | Ahmed | H01L 29/78609 257/43 |
| 2016/0181430 A1* | 6/2016 | Ahmed | H01L 29/7869 257/43 |
| 2016/0260748 A1* | 9/2016 | Lin | H01L 27/1225 |

* cited by examiner

ARRAY SUBSTRATES AND THE MANUFACTURING METHOD THEREOF, AND DISPLAY PANELS OF ENHANCED SPEED OF FILM FORMATION

BACKGROUND OF THE INVENTION

1. Field of the Invention

The present disclosure relates to liquid crystal display technology, and more particularly to an array substrate and the manufacturing method thereof, and the display panel.

2. Discussion of the Related Art

Currently, the etch stop layer (ESL) of thin film transistors (TFTs) of liquid crystal panels mainly include SiO. As hydrogen is needed when producing SiO, and thus the reaction gas has to contain hydrogen, i.e., the ESL contains hydrogen.

However, during the film formation of the ESL, adjacent trench layers may be recovered if the temperature is too high for the reason that the ESL contains hydrogen, and the performance of the trench layer of the TFT may be affected. If the temperature is too low, the ESL may contain too much hydrogen, and pin holes may occur, which may affect the quality of the ESL of the TFTs. In order to ensure the quality of the TFT, a higher requirement of the film formation of the ESL has been demanded, which may result in a slow speed of film formation.

SUMMARY

According to the present disclosure, the array substrate and the manufacturing method thereof and the display panel are capable of ensuring the quality of TFTs. In addition, the speed of film formation of the ESL may be enhanced.

In one aspect, an array substrate includes: an array substrate having a substrate and a plurality of TFTs, the TFT including a gate, a gate insulation layer, a trench layer, an ESL, a source, and a drain, the gate insulation layer being arranged between the gate and the trench layer to insulate the gate from the trench layer, and the source, the drain, and the ESL being respectively arranged on the trench layer, the ESL being arranged between the source and the drain, wherein the ESL being an AlN film.

Wherein the AlN film is manufactured by sputtering via magnetron sputtering devices, and an AL chamber is filled with hydrogen or mixed gas of argon and hydrogen.

Wherein a ratio of the argon to the hydrogen is in a range between 0 and 90%.

Wherein the gate insulation layer is the AlN film.

Wherein the trench layer is made by metallic oxide.

In another aspect, a manufacturing method of array substrates includes: forming a gate, a gate insulation layer, and a trench layer on a substrate, wherein the gate insulation layer being arranged between the gate and the trench layer; and forming an ESL, a source and a drain on the trench layer, the ESL being arranged between the source and the drain, wherein the ESL is AlN film.

Wherein the step of forming the ESL on the trench layer including: applying a sputtering process by a magnetron sputtering device to form the AlN film on the trench layer, wherein an AL chamber is filled with hydrogen or mixed gas of argon and hydrogen.

Wherein a ratio of the argon to the hydrogen is in a range between 0 and 90%.

Wherein a temperature of the substrate during a film formation process is in a range between 25 and 300 Celsius.

In another aspect, a display panel includes: an array substrate having a substrate and a plurality of thin film transistors (TFTs), the TFT including a gate, a gate insulation layer, a trench layer, an etch stop layer (ESL), a source, and a drain, the gate insulation layer being arranged between the gate and the trench layer to insulate the gate from the trench layer, and the source, the drain, and the ESL being respectively arranged on the trench layer, the ESL being arranged between the source and the drain, the ESL being an aluminum nitride (AlN) film manufactured by sputtering via magnetron sputtering devices, wherein an AL chamber is filled with hydrogen or mixed gas of argon and hydrogen.

Wherein a ratio of the argon to the hydrogen is in a range between 0 and 90%.

Wherein the trench layer is made by metallic oxide.

In view of the above, the AlN film operates as the ESL of the TFT of the array substrate. As the AlN film has not contained hydrogen, the high or low temperature may not result in a recovery of the trench layer or result in a pin hole of the ESL during the film formation of the ESL. This ensures the performance of the TFT. In addition, as there is no temperature limitation during the film formation of the AlN film, the film formation process may be executed in a higher efficiency.

DETAILED DESCRIPTION OF THE EMBODIMENTS

Embodiments of the invention will now be described more fully hereinafter with reference to the accompanying drawings, in which embodiments of the invention are shown.

Figure 1:
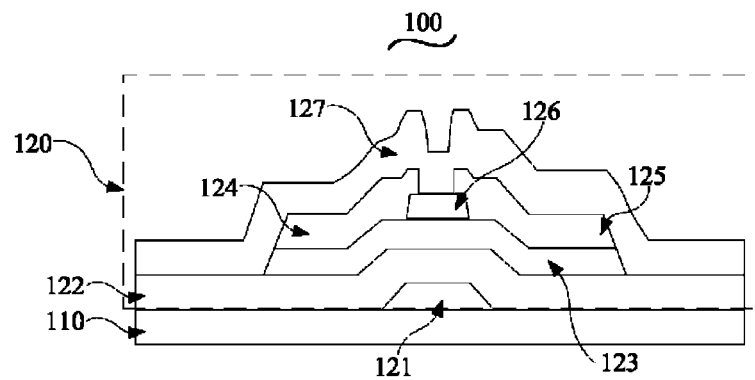
FIG. 1 is a schematic view of the array substrate in accordance with one embodiment.

FIG. 1 is a schematic view of the array substrate in accordance with one embodiment. The array substrate 100 includes a substrate 110 and a plurality of TFTs 120, wherein only one TFT 120 is shown on the substrate 110 as one example. The substrate 110 may be a glass substrate or a transparent substrate made by other insulation materials. The TFTs 120 includes a gate 121, a gate insulation layer 122, a trench layer 123, a source 124, a drain 125, and an ESL 126 on the substrate 110. The gate insulation layer 122 is arranged between the gate 121 and the trench layer 123 so as to insulate the gate 121 from the trench layer 123. The source 124, the drain 125, and the ESL 126 are arranged on the same layer. The source 124, the drain 125, and the ESL 126 are respectively arranged on the trench layer 123, and the ESL 126 is arranged between the source 124 and the drain 125 to insulate the source 124 from the drain 125. When the gate 121 obtains the voltage larger than or equal to the turn-on voltage, the trench layer 123 may generate electrons to connect the source 124 and the drain 125.

The ESL 126 may be AlN film, which is good insulation material and thus can provide a good insulation effect between the source 124 and the drain 125. In addition, the AlN film is characterized by attributes such as high breakdown field strength (1.2-1.8 MV/cm), high thermal conductivity, high chemical and heat stability, and the transmission rate for the visible lights is around 90%. In addition, as AlN film has not contained hydrogen, the high or low temperature may not result in a recovery of the trench layer or result in a pin hole of the ESL during the film formation of the ESL. This ensures the performance of the TFT. In addition, as there is no temperature limitation during the film formation of the AlN film, the film formation process may be executed in a higher efficiency.

In the embodiment, the trench layer 123 may be made by metallic oxide, such as indium gallium zinc oxide (IGZO).

The gate 121 may be AlN film. As AlN film has not contained hydrogen, during the operations of the array substrate, the gate insulation is prevented from capturing or releasing the electrons. As such, the threshold voltage of the TFT may have positive drift or negative drift so as to ensure the stability of the TFTs.

The TFTs 120 may further include a passivation layer 127 covering the source 124 and the drain 125. In other embodiments, a silicide layer may be arranged between the source, the drain, and the passivation layer to prevent Cu ions of the source and the drain from being diffused to the passivation layer 127.

In the above configuration, the gate 121, the trench layer 123, the source 124, and the drain 125 may be generated by physical vapor deposition (PVD). The passivation layer 127 may be generated by Plasma Enhanced Chemical Vapor Deposition (PECVD).

The AlN film may be etched by ICP devices or by manufactured by, for instance, magnetron sputtering methods.

In another embodiments, the AlN film may be manufactured by magnetron sputtering methods. For instance, hydrogen or a mixed gas of argon and hydrogen is filled into Al chamber. With respect to the mixed gas, the ratio of the argon to the hydrogen is in a range between 0 and 90%. For instance, the ratio may be 0%, 45%, or 90%.

During the film formation process of magnetron sputtering, the temperature of the substrate is in a range between 25 and 300 Celsius, such as 25, 85, or 300 Celsius.

As the AlN film may be manufactured by processes such as magnetron sputtering methods, which may be conducted in normal temperature. Thus, the trench layer 123 may be prevented from being damaged by the ESL such that electrical properties of the TFTs may not be affected. In addition, compared to the CVD process, the AlN film may be formed in a higher speed when adopting PVD process, which contributes to the throughput.

In another embodiment, the array substrate may include a plurality of data lines, scanning lines, and pixel electrodes (not shown) on the substrate. The data line connects with the source of the TFT, the scanning line connects with the gate of the TFT, and the pixel electrode connects with the drain. When the gate of the TFT obtain the voltage larger than or equal to the turn-on voltage, the source and the drain of the TFT are connected. That is, the data line connects with the pixel electrodes such that the pixel electrodes obtain the voltage inputted from the data line.

In order to increase the aperture rate of the pixel electrodes, the source, the drain, and the pixel electrodes may be integrally formed by transparent conductive film.

Figure 2:
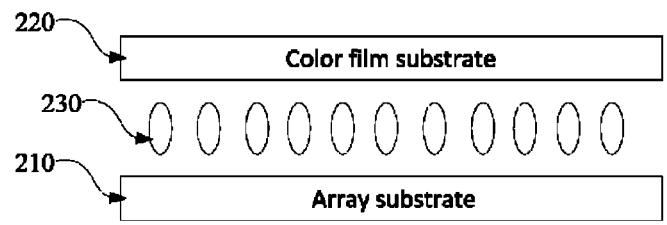
FIG. 2 is a schematic view of the display panel in accordance with one embodiment.

FIG. 2 is a schematic view of the display panel in accordance with one embodiment. The display panel includes an array substrate 210, a color film substrate 220, and liquid crystals arranged between the array substrate 210 and the color film substrate 220. The array substrate 210 may be the array substrate as described above. The color film substrate 220 may include a substrate and the black matrix, color filters (CFs), a protection film, and an ITO film on the substrate. The pixel electrodes of the array substrate obtain the display voltage inputted from the data line to form an electrical field between the CF and the ITO film.

Figure 3:
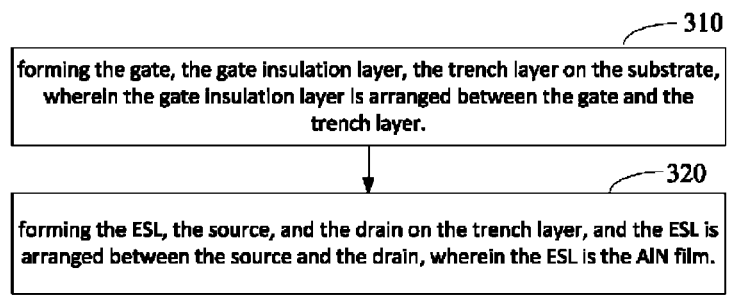
FIG. 3 is a flowchart illustrating the manufacturing method of the array substrate in accordance with one embodiment.

FIG. 3 is a flowchart illustrating the manufacturing method of the array substrate in accordance with one embodiment.

In block 310, the gate, the gate insulation layer, the trench layer are formed on the substrate, wherein the gate insulation layer is arranged between the gate and the trench layer.

In the embodiment, the gate is formed on the substrate, and the gate insulation is arranged on the gate. Afterward, the trench layer is formed on the gate insulation layer, wherein the gate and the trench layer may be formed by PVD processes. The gate insulation layer may be AlN film.

In block 320, the ESL, the source, and the drain are formed on the trench layer. The ESL is arranged between the source and the drain, wherein the ESL may be the AlN film.

After forming the trench layer, the AlN film, the source, and the drain are respectively formed on the trench layer, wherein the AlN film operates as the ESL and is arranged between the source and the drain.

The AlN film may be etched by ICP devices or by manufactured by, for instance, magnetron sputtering methods.

In an example when adopting the magnetron sputtering method, hydrogen or a mixed gas of argon and hydrogen is filled into Al chamber. With respect to the mixed gas, the ratio of the argon to the hydrogen is in a range between 0 and 90%. For instance, the ratio may be 0%, 45%, or 90%.

During the film formation process of magnetron sputtering, the temperature of the substrate is in a range between 25 and 300 Celsius, such as 25, 85, or 300 Celsius.

As the AlN film may be manufactured by processes such as magnetron sputtering methods, which may be conducted in normal temperature. Thus, the trench layer 123 may be prevented from being damaged by the ESL such that electrical properties of the TFTs may not be affected. In addition, compared to the CVD process, the AlN film may be formed in a higher speed when adopting PVD process, which contributes to the throughput. It can be understood that when the gate insulation formed in block 310 is the AlN film, the above method may be adopted to manufacture the AlN film.

In another embodiment, a passivation layer may be formed respectively on the source and the drain.

Specifically, the source and the drain may be formed by the PVD process, and the above passivation layer may be formed by PECVD processes.

Yet in another embodiment, the manufacturing method includes forming a plurality of scanning lines, data lines, and pixel electrodes on the substrate. The data line electrically contacts with the source of the TFT, the scanning line electrically contacts with the gate of the TFT, and the pixel electrodes electrically contacts with the drain of the TFT.

In the above examples, the AlN film is adopted as the ESL of the TFT of the array substrate. As AlN film has not contained hydrogen, the high or low temperature may not result in a recovery of the trench layer or result in a pin hole of the ESL during the film formation of the ESL. This ensures the performance of the TFT. In addition, as there is no temperature limitation during the film formation of the AlN film, the film formation process may be executed in a higher efficiency.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of array substrates of enhancing speed of film formation, comprising:
    forming a gate, a gate insulation layer, and a trench layer on a substrate, wherein the gate insulation layer being arranged between the gate and the trench layer; and
    forming an ESL, a source and a drain on the trench layer, the ESL being arranged between the source and the drain, wherein the ESL is AlN film, and applying a sputtering process by a magnetron sputtering device to form the AlN film on the trench layer, wherein an AL chamber is filled with hydrogen or mixed gas of argon and hydrogen.

2. The manufacturing method as claimed in claim 1, wherein a ratio of the argon to the hydrogen is in a range between 0 and 90%.

3. The manufacturing method as claimed in claim 1, wherein a temperature of the substrate during a film formation process is in a range between 25 and 300 Celsius.

* * * * *